(12) United States Patent
Fogg et al.

(10) Patent No.: US 6,350,134 B1
(45) Date of Patent: Feb. 26, 2002

(54) ELECTRICAL CONNECTOR HAVING TRIAD CONTACT GROUPS ARRANGED IN AN ALTERNATING INVERTED SEQUENCE

(75) Inventors: Michael W. Fogg, Harrisburg; Russell D. Moser, Lewisberry, both of PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/624,832

(22) Filed: Jul. 25, 2000

(51) Int. Cl.[7] .............................. H01R 12/00; H05K 1/00
(52) U.S. Cl. ............................................ 439/79; 439/941
(58) Field of Search .......................... 439/941, 79, 108, 439/608, 101, 404, 676, 60

(56) References Cited

U.S. PATENT DOCUMENTS

| | | | |
|---|---|---|---|
| 4,762,500 A | 8/1988 | Dola et al. .................... 439/79 |
| 4,975,084 A | 12/1990 | Fedder et al. ................ 439/608 |
| 5,046,960 A | 9/1991 | Fedder ........................ 439/108 |
| 5,114,355 A | 5/1992 | Kimmel et al. .............. 439/101 |
| 5,161,987 A | * 11/1992 | Sinisi .......................... 439/108 |

* cited by examiner

Primary Examiner—Neil Abrams
Assistant Examiner—Javaid Nasri

(57) ABSTRACT

An electrical connector 1 of controlled impedance includes a housing 2 on which are mounted consecutive signal transmission line pairs 12 in consecutive reverse order, each signal transmission line pair 12 being provided by a pair 7 of signal contacts 8 in one contact row 6 opposing a ground contact 9 in another contact row 6, and by having the consecutive signal transmission line pairs 12 in reverse order, the signal contacts 8 of each signal transmission line pair 12 are arranged consecutively with an adjacent ground contact 9 of another signal transmission line pair 12 of reversed order, which minimizes cross talk between different pairs 7 of signal contacts 8, and which provides maximized areas surrounding the signal contacts 8 and the ground contacts 9 for routing circuit paths.

12 Claims, 13 Drawing Sheets

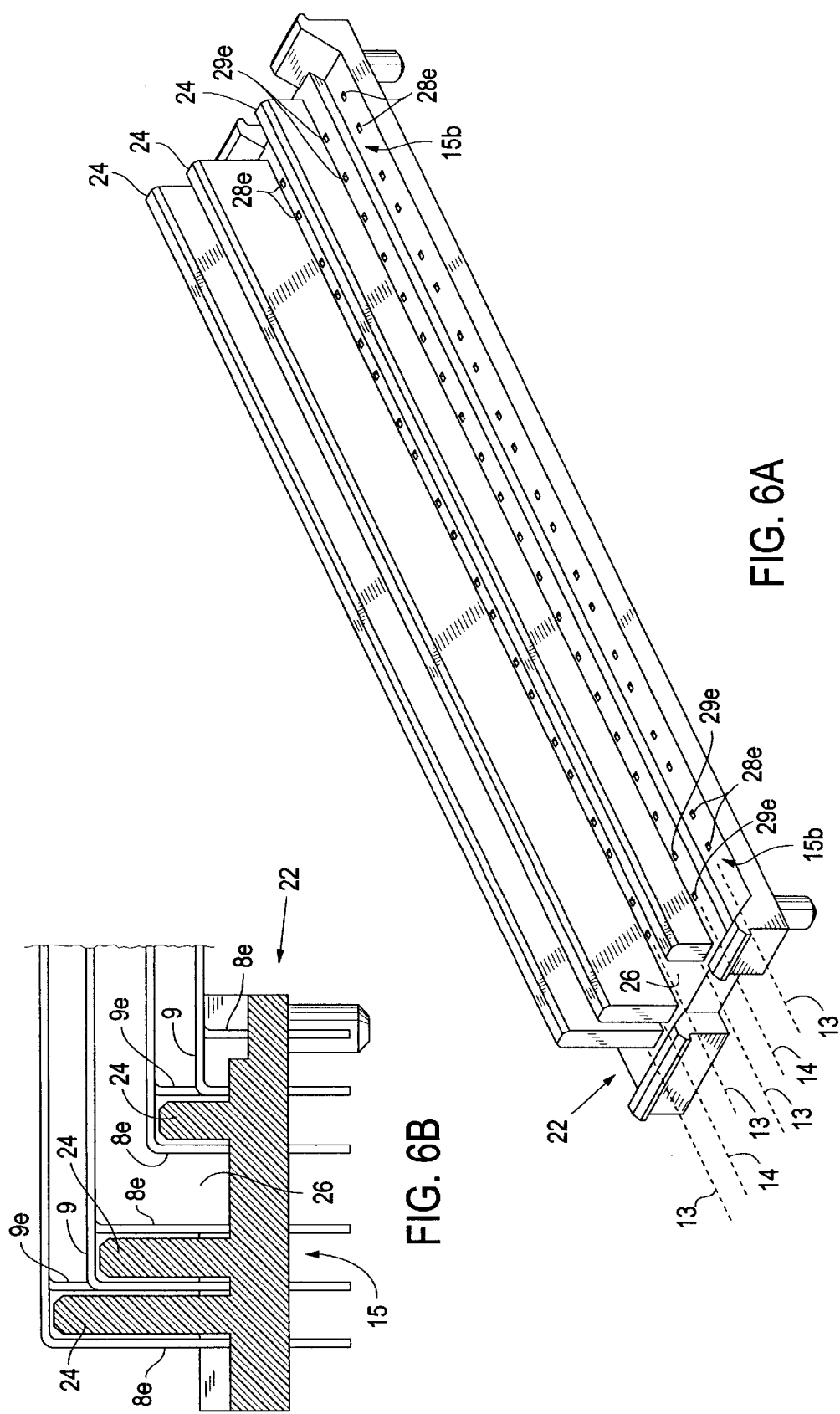

ELECTRICAL CONNECTOR HAVING TRIAD CONTACT GROUPS ARRANGED IN AN ALTERNATING INVERTED SEQUENCE

FIELD OF THE INVENTION

The invention relates to an electrical connector for transmitting high speed electronic signals, and more particularly, to an electrical connector having signal contacts opposing a ground contact to provide signal transmission lines of controlled characteristic impedance and low cross talk.

BACKGROUND OF THE INVENTION

Electronic devices that operate, in part, to send electronic signals and to receive electronic signals communicate with one another by way of the electronic signals that are transmitted over signal transmission lines provided by a transmission line device, for example, a circuit board or an electrical cable. New electronic devices continue to be developed, which transmit the signals at ever increasing speed, and which devices simultaneously process increased numbers of simultaneously occurring signals. Further, these new electronic devices benefit from miniaturization, which increases the number of circuits for processing signals simultaneously, and which significantly reduces signal transmission delays, as the electronic devices become more miniaturized.

The signal transmission lines, which connect with the electronic devices that communicate with one another, transmit multiple high-speed signals with minimized signal distortion. Further, the signal transmission lines, as well as associated electrical connectors that connect with the transmission lines, are of controlled characteristic impedance that matches the characteristic impedance of the electronic devices to which the transmission lines are connected. The electrical connectors of matched characteristic impedance are also known as matched impedance electrical connectors. The signal transmission lines and the electrical connectors benefit from miniaturization, similarly as do the electronic devices.

A known electrical connector of the matched impedance type has signal contacts provided with electrical terminals for making electrical connections with signal transmission lines on a transmission line device, such as circuit traces on a circuit board or electrical conductors of an electrical cable. Further, the known electrical connector has a single broad, conducting ground contact with multiple tails. The signal contacts are arranged to oppose the ground contact, which provides signal transmission lines of controlled characteristic impedance. For example, an embodiment of the known electrical connector is disclosed by U.S. Pat. No. 5,114,355, and has an insulating housing that urges both a ground contact and an entire contact row of signal contacts against an intervening wall on the housing, which minimizes variations in characteristic impedance along the lengths of the signal contacts.

The characteristic impedance is determined by mathematical analysis of each signal transmission line of the electrical connector. The mathematical analysis emulates the well-known mathematical analysis of a microstrip type of transmission line to determine its characteristic impedance. The characteristic impedance of a signal transmission line of an electrical connector is determined, partly by a ratio, of the width of a signal contact versus the thickness of each of the dielectric materials separating the signal contact from the opposed ground contact, and partly by the permittivity and other properties of such dielectric materials, which influence propagation of a signal in the respective dielectric materials. Such dielectric materials for an electrical connector assembly may include the insulation material of the housing. Further, such dielectric materials may include ambient air, for example, as disclosed by U.S. Pat. No. 5,046,960, wherein an embodiment of the known electrical connector is purposely provided with air reservoirs of controlled widths, as determined by analytical methods, on both sides of a ground bus, which assist in controlling characteristic impedance.

The known electrical connector may include signal contacts that are arranged in pairs. Each pair of signal contacts opposes a ground contact to provide a signal transmission line pair of controlled characteristic impedance. A signal transmission line pair is desirable in an electrical connector for transmitting differential pair signals. Differential pair signals are ideally, two simultaneous signals of equal signal strength and of opposite polarity. The signal contacts of each signal transmission line pair transmit the differential pair signals. Any cross talk influences as between the signal contacts of the same pair effectively cancel, because such cross talk influences occur simultaneously and are of opposite polarity. However, in the known electrical connector, consecutive signal transmission line pairs are provided by having the pairs of signal contacts arranged consecutively in the same contact row, which means that cross talk between such consecutive pairs of signal contacts may exceed acceptable levels. Specifically, as such pairs of contacts transmit high-speed signals, undesired levels of cross talk are induced in another pair of consecutively arranged signal contacts. The levels of cross talk can be reduced to acceptable levels by spacing consecutive pairs of contacts sufficiently far apart from one another in the same contact row. However, spacing the pairs of contacts far apart increases the length of the contact row and prevents desired miniaturization of the electrical connector. Accordingly, a need exists for an electrical connector having signal transmission line pairs that avoid consecutively arranged pairs of signal contacts.

Another embodiment of the known electrical connector is disclosed by U.S. Pat. No. 4,975,084, and has pairs of signal contacts arranged consecutively in a column. The column is essentially a contact row that extends transversely of the length of the known electrical connector, instead of a contact row that extends lengthwise of the known electrical connector. Because the pairs of signal contacts are arranged consecutively in the contact row, they contribute to unacceptable levels of cross talk. Consecutive pairs of signal contacts have the same disadvantages, whether the consecutive pairs are in a contact row that extends lengthwise of an electrical connector, or whether the consecutive pairs are in a contact row that extends transversely, as a column.

Further, having consecutive pairs of signal contacts arranged close together, means that pairs of signal terminals on the pairs of signal contacts are arranged close together, and provide an inadequate space surrounding the pairs of signal terminals for limiting cross talk to acceptable levels.

Another disadvantage stems from having the pairs of signal contacts arranged consecutively in a contact row. The pairs of signal contacts have corresponding pairs of signal terminals thereon for making electrical connections to signal transmission lines on a transmission line device, such as signal transmission lines on a circuit board, or electrical conductors of an electrical cable. As consecutive pairs of signal contacts become more closely spaced together to achieve miniaturization of the known electrical connector, the corresponding pairs of signal terminals become more crowded together, which means there is insufficient space surrounding the consecutive pairs of signal terminals within which to route signal transmission lines, and within which to provide terminal connection areas, also known as pads, to which the signal and ground terminals are connected.

In each embodiment of the known electrical connector, the ground contact serves as a ground bus for an entire contact row of consecutive signal contacts. One disadvantage is that signals being transmitted by such contacts increase inductance in the ground contact. In response to minimizing this disadvantage, another embodiment of the known electrical connector, referred to as a connector half by U.S. Pat. No. 4,762,500, has a ground bus that is provided with multiple tails for connection to ground or reference electrical potential to minimize ground bus inductance. The tails are also known as ground terminals. However, increasing the number of ground terminals means that the ground terminals become crowded, and there is insufficient space surrounding the ground terminals within which to route signal transmission lines, and within which to provide terminal connection areas, or pads, to which the ground terminals are connected.

Accordingly, an object of the invention is to satisfy an existing need for an electrical connector, which has consecutive pairs of signal transmission lines of controlled characteristic impedance, and which eliminates consecutive pairs of signal contacts in the same contact row to minimize levels of cross talk.

Another object of the invention is to satisfy an existing need for an electrical connector having consecutive pairs of signal transmission lines of controlled characteristic impedance as provided by pairs of signal contacts opposing ground contacts, and yet provide adequate spaces surrounding pairs of signal terminals on the signal contacts for reducing cross talk and for providing connection pads and for routing signal transmission lines.

Another object of the invention is to satisfy an existing need for an electrical connector having consecutive pairs of signal transmission lines, and the connector minimizes the number of ground terminals on a ground contact, which reduces crowding of the of the ground terminals, and provides adequate spaces surrounding the ground terminals within which to provide terminal connection areas, or pads, and within which to route signal transmission lines.

SUMMARY OF THE INVENTION

The invention includes an electrical connector having consecutive signal transmission line pairs. Each signal transmission line pair has a pair of signal contacts in one contact row opposing a ground contact in another contact row. A ground contact of a consecutive signal transmission line pair faces in a reverse direction from the one faced by a ground contact of a previous signal transmission line pair. A ground contact of the consecutive signal transmission line pair is in the same contact row as is a pair of signal contacts of the previous signal transmission line pair, such that, each consecutive signal transmission line pair faces in a reverse direction from the one faced by a previous signal transmission line pair. The electrical connector minimizes cross talk between different pairs of signal contacts by having consecutive signal transmission line pairs facing in reverse directions, which avoids an arrangement of consecutive pairs of signal contacts in the same contact row, as was provided by prior, known electrical connectors.

According to a further feature of the invention, an electrical connector has consecutive signal transmission line pairs. Each signal transmission line pair has a pair of signal contacts in one contact row opposing a ground contact in another contact row. A ground contact of a consecutive signal transmission line pair is in the same contact row as is a pair of signal contacts of a previous signal transmission line pair. The pair of contacts of the previous signal transmission line pair has a corresponding previously arranged pair of signal terminals extending to one terminal row. The pair of signal contacts of the consecutive signal transmission line pair has a corresponding consecutively arranged pair of signal terminals extending to another terminal row. The ground contacts of both the consecutive signal transmission line pair and the previous signal transmission line pair have respective single ground terminals extending to an intervening terminal row that is between said one terminal row and said another terminal row. Advantageously, the ground terminals extending to the intervening terminal row serve to intervene between the consecutively arranged pair of signal terminals and the previously arranged pair of signal terminals, which minimizes cross talk influences between the consecutively arranged pair of signal terminals and the previously arranged pair of signal terminals. Further, advantageously, respective ground contacts have respective single ground terminals, which reduces the number of terminals on each of the ground contacts.

According to another feature of the invention, each signal transmission line pair has a group of terminals that is provided by a single ground terminal on a corresponding ground contact and a pair of signal terminals on a corresponding pair of signal contacts, and each pair of signal terminals extend along centerlines that are closer together than are the centerlines of the corresponding pair of signal contacts, which minimizes a space between each pair of signal terminals, and which maximizes a space surrounding each group of terminals for routing signal transmission lines on a transmission line device to which the group of terminals is to be connected. Further, the respective laterally offset portions situate the respective pair of signal terminals relatively close together, thereby decreasing a space between the pair of respective signal terminals and increasing a cross talk reducing space surrounding the pair of respective signal terminals.

According to another feature of the invention, each signal transmission line pair has a pair of signal terminals and a single ground terminal arranged in a group of terminals, the pair of signal terminals are on a corresponding pair of signal contacts, the single ground terminal is on a corresponding ground contact that is spaced at a distance from the pair of signal contacts, and the single ground terminal extends along a centerline that is closer to the pair of signal terminals than the distance between the ground contact and the pair of signal contacts, which minimizes a space between the ground contact and the pair of signal terminals, and which maximizes a space surrounding the group of terminals for routing signal transmission lines on a transmission line device to which the group of terminals is to be connected.

According to a further feature of the invention, each signal transmission line pair has a pair of signal terminals and a single ground terminal arranged in a group of terminals, the signal terminals of each signal transmission line pair extend along centerlines that intersect corners of a base of a triangular area for the signal transmission line pair, the ground terminal of each signal transmission line pair extends along a centerline that intersects an apex of the triangular area, and the triangular area for a consecutive signal transmission line pair is inverted with respect to a triangular area for a previous signal transmission line pair, which arranges the pairs of signal terminals of the consecutive and previous signal transmission line pairs a maximized distance apart to minimize cross talk influences therebetween.

Other objects and advantages of the invention will become apparent from the following description taken in conjunction with accompanying drawings.

DESCRIPTION OF THE DRAWINGS

Embodiments of the invention will now be described by way of example with reference to the accompanying drawings, according to which:

FIG. 6A is an isometric view of an alternative pin spacer;

FIG. 6B is a fragmentary view of the pin spacer as shown in FIG. 6A, together with portions of signal terminals and ground terminals;

DETAILED DESCRIPTION

Figure 1:
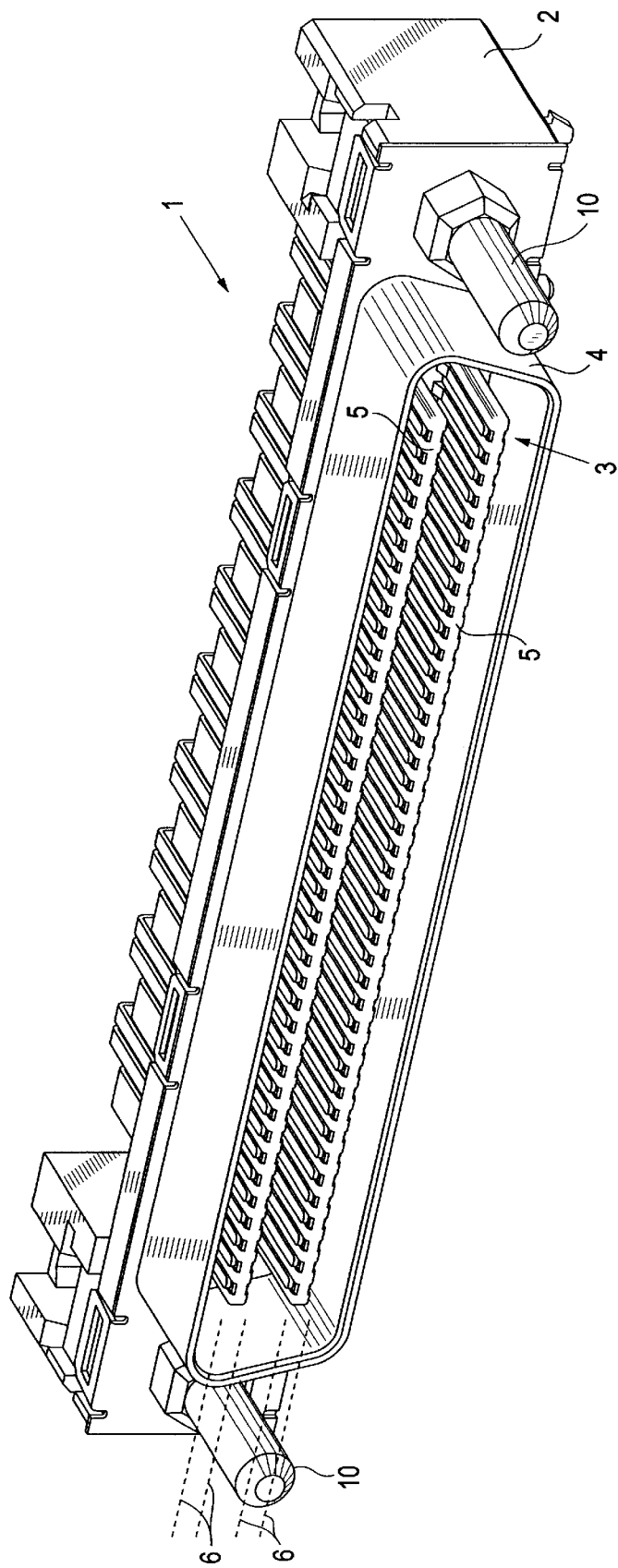
FIG. 1 is an isometric view of a composite electrical connector having two plug type electrical connectors in a stacked arrangement, one on the other, and combined together in a common insulating housing.
Figure 2:
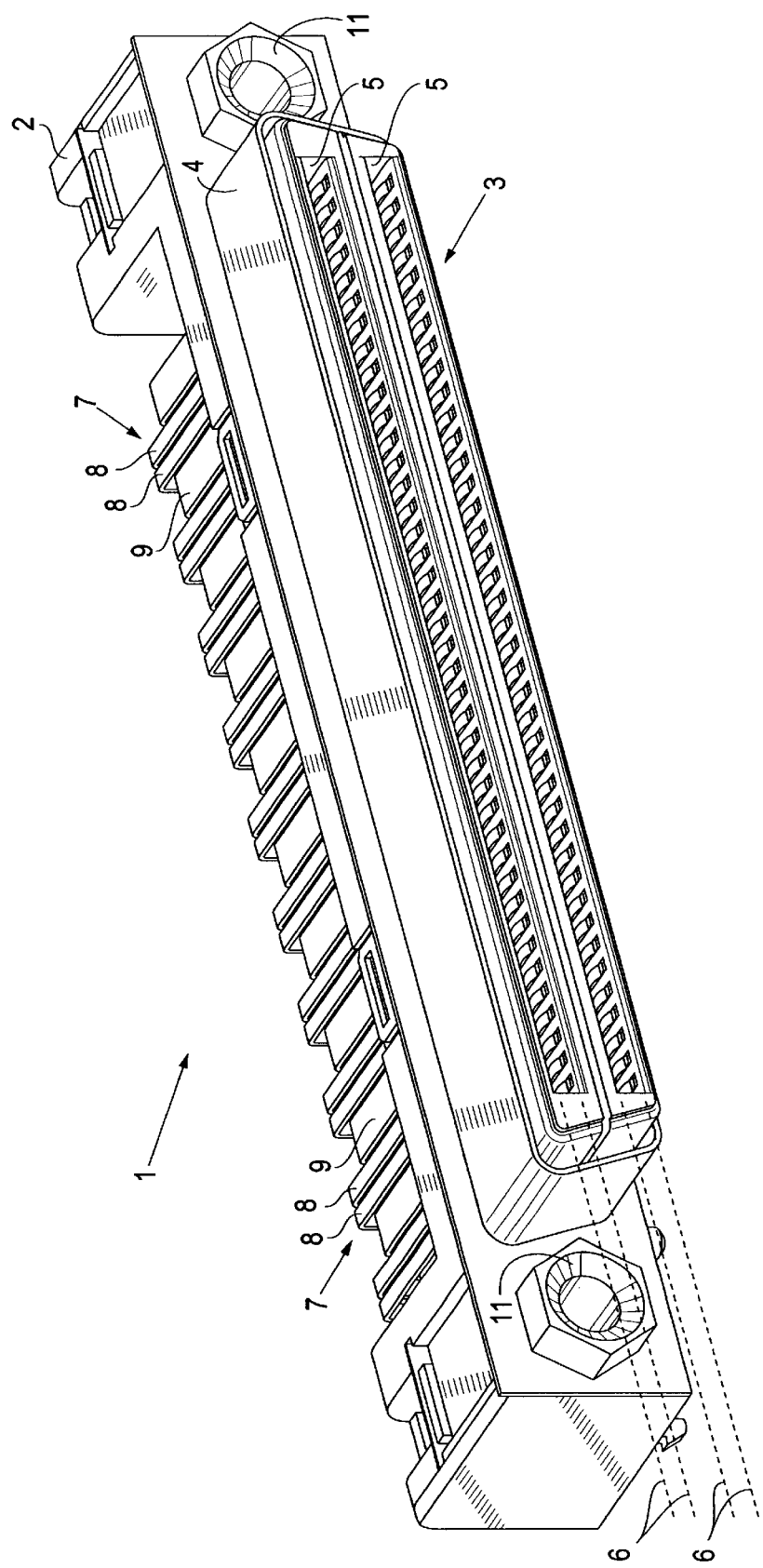
FIG. 2 is an isometric view of a composite electrical connector having two receptacle type electrical connectors in a stacked arrangement, one on the other, and combined together in a common insulating housing.

FIG. 1 and FIG. 2 show mating, composite electrical connectors 1 of similar construction. Each connector 1 includes an insulating housing 2 having an open, front mating end 3 that is laterally elongated and situated within the perimeter of an encircling shroud 4, which shroud 4 is a portion of a hollow metal shell attached to the housing 2. The housing 2 of the connector 1 is formed with two connector-mating portions 5 that are stacked one above the other. Each connector-mating portion 5 is defined by a laterally elongated portion of the housing 2 that is within the mating end 3. Each connector-mating portion 5 intervenes between two nonintersecting contact rows 6, indicated by respective broken lines extending along opposite sides of each connector-mating portion 5. The two contact rows 6 receive pairs 7 of signal contacts 8 and multiple, single ground contacts 9, which are shown in each of FIGS. 1 and 2, as projecting rearward. The pairs 7 of signal contacts 8 alternate with the single ground contacts 9 along each of the two contact rows 6 for each connector-mating portion 5.

The connector 1 as shown in FIG. 1 is a composite of two plug type electrical connectors 1, with the two connector-mating portions 5 being in the form of two electrical plugs, stacked one above the other. The connector shown in FIG. 1 has elongated alignment pins 10 projecting forward.

The connector 1 as shown in FIG. 2 is a composite of two receptacle type electrical connectors 1, with the two connector-mating portions 5 being in the form of two plug-receiving electrical receptacles, stacked one above the other. The connector 1 shown in FIG. 2 has alignment sockets 11 at the mating end 3.

Figure 3:
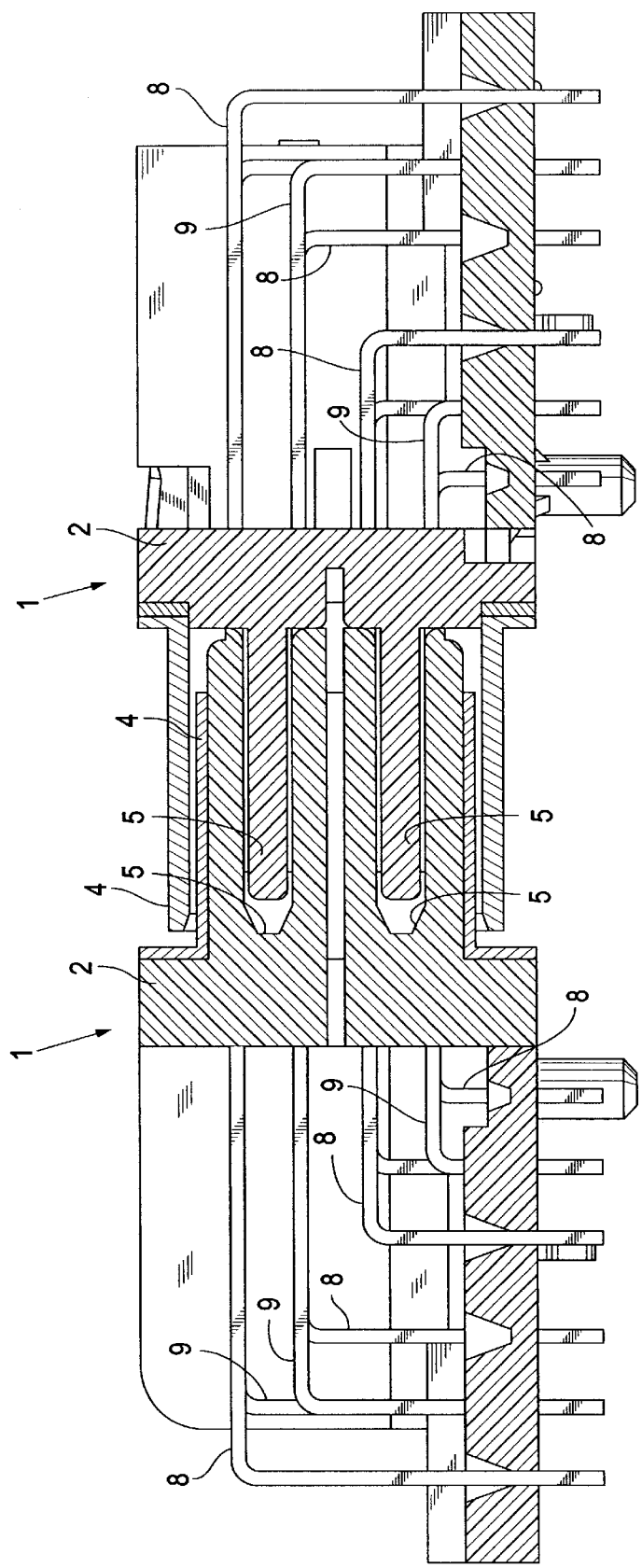
FIG. 3 is a side view in section of the composite electrical connector, as shown in FIG. 1, mated with the composite electrical connector, as shown in FIG. 2.

FIG. 3 discloses the composite connector 1 of FIG. 1 and the composite connector 1 of FIG. 2 mating with each other. The alignment sockets 11 receive the alignment pins 10, which guide the two connectors 1 into mating connection with each other. The shrouds 4 of the two connectors 1 frictionally overlap and electrically connect to provide an electrical shield. The plug receiving receptacles 5 receive the electrical plugs 5 in mating connection, when the two composite connectors 1 mate with each other. The pairs 7 of signal contacts 8 of the receptacle type electrical connectors 1 matingly engage with those of the plug type electrical connectors 1. The ground contacts 9 of the receptacle type connectors 1 matingly engage with those of the plug type connectors 1.

Figure 4:
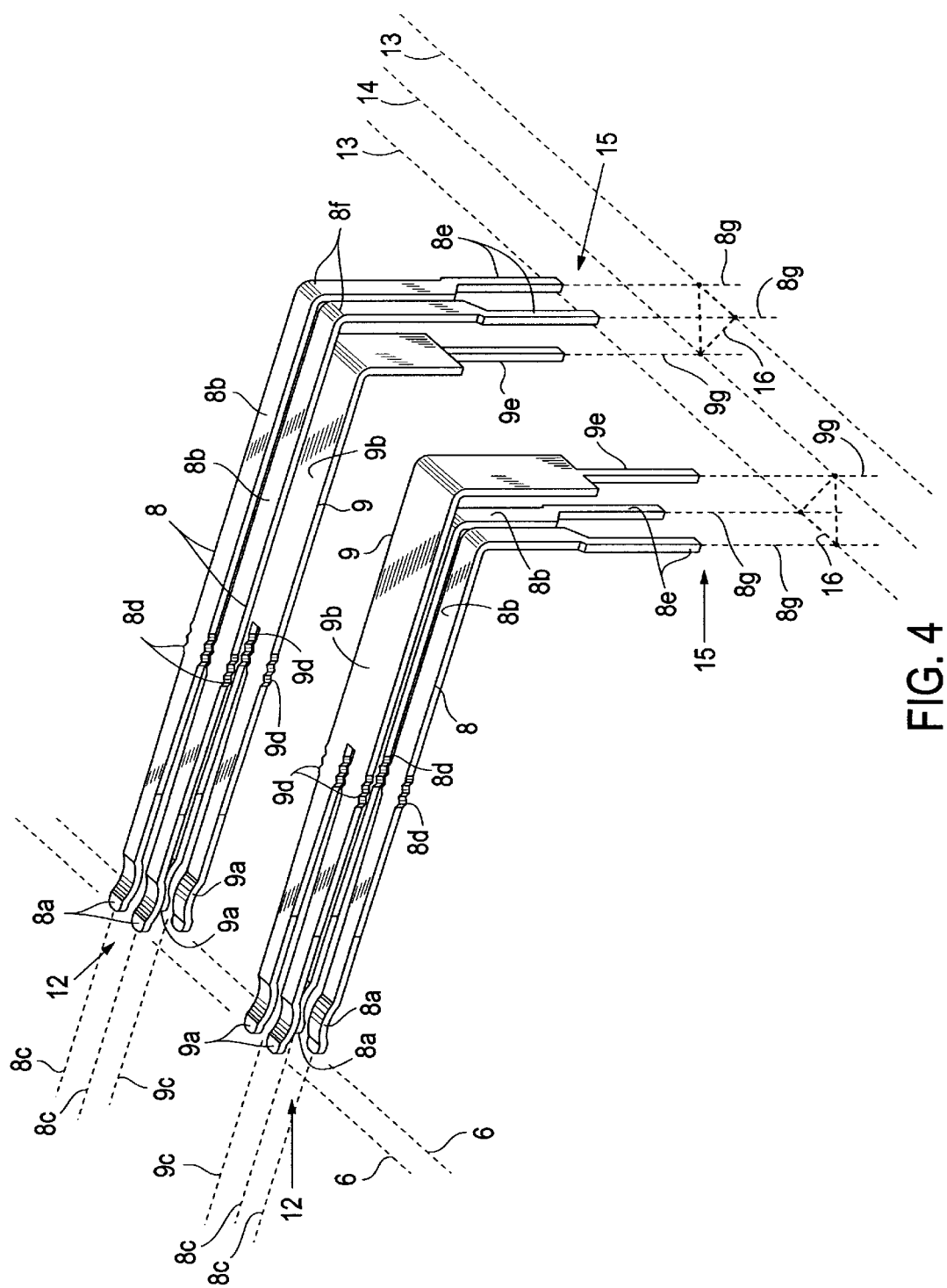
FIG. 4 is an enlarged isometric view of two pairs of signal contacts, with each pair opposing a single ground contact to provide two consecutive signal transmission line pairs.

For each of the composite connectors 1, as shown in FIGS. 1 and 2, the pairs 7 of signal contacts 8 and the ground contacts 9 in the respective contact rows 6 are arranged on opposite sides of the connector-mating portions 5 to provide consecutive signal transmission line pairs 12, as shown in FIG. 4. Specifically, FIG. 4 discloses two of the consecutive signal transmission line pairs 12, arranged as though they would be arranged in either one of the composite electrical connectors 1. Each signal transmission line pair 12 includes a single ground contact 9. Further, each signal transmission line pair 12 includes a pair 7 of signal contacts 8 for transmitting electrical signals. Each pair 7 of signal contacts 8 is arranged to oppose an opposing single ground contact 9. The opposing single ground contact 9 provides a ground plane to which the pair 7 of signal contacts 8 are referenced. Each pair 7 of signal contacts 8 and an opposed single ground contact 9 are to be assembled in an electrical connector 1, in a manner to be described, which provides a signal transmission line pair 12 of controlled characteristic impedance. To control impedance, the signal contacts 8 of each signal transmission line pair 12 are of controlled width and spacing apart. Further, the signal contacts 8 of each signal transmission line pair 12 are symmetrical about a space therebetween. Further, the signal contacts 8 of each signal transmission line pair 12 are symmetrically spaced from a corresponding ground contact 9 to control impedance.

FIG. 4 discloses further details of construction that are similar for each pair 7 of signal contacts 8. Specifically, the signal contacts 8 are of unitary construction, stamped and formed from a metal strip, for example. Each pair 7 of signal contacts 8 has a respective pair of contact mating portions 8a. The contact mating portions 8a are in the form of resilient spring fingers that extend lengthwise of respective elongated body portions 8b. The signal contacts 8 have respective centerlines 8c along the respective body portions 8b and contact mating portions 8a. The body portions 8b have respective laterally projecting blunt barbs 8d, for purposes to be described. One of the pairs 7 of signal contacts 8 is arranged in a lower one of the two contact rows 6 that are indicated by dotted lines in FIG. 4. Another of the pairs 7 of signal contacts 8 is arranged in another of the two adjacent contact rows 6, above the lower one of the two contact rows 6. The signal contacts 8 of each respective pair 7 are of the same length to reduce or minimize signal skew.

With further reference to FIG. 4, each pair 7 of signal contacts 8 has a respective pair of signal terminals 8e joined to the elongated body portions 8b. The signal terminals 8b are in the form of slender pins. Alternatively, the signal terminals 8e may have other slender forms, such as, resilient spring fingers or solder tabs or compliant pins. The pair of signal terminals 8e are bent where they join the body portions 8b to extend at respective right angles with the remainders of the signal contacts 8. Alternatively, the pair of signal terminals 8e may extend without a bend or may extend at any desired angle.

With further reference to FIG. 4, each pair 7 of signal contacts 8 have laterally offset portions 8f at the junction of the pair of signal terminals 8e with the elongated body portions 8b. The offset portions 8f position or arrange the pair of signal terminals 8e along centerlines 8g thereof that are farther apart than are the centerlines 8c of the remainders of the signal contacts 8. The space between the pair of signal terminals 8e of each signal transmission line pair 12 is optimized, as will be described.

One of the pairs 7 of signal terminals 8, being shorter than the other pair 7 of signal terminals 8, extends to be arranged in a closer one of two nonintersecting, signal terminal rows 13 that are indicated by dotted lines in FIG. 4. Another of the pairs of signal terminals 8e, being longer, extends to be arranged in another of the two terminal rows 13, which is relatively farther away than the closer one of the two terminal rows 13. The signal terminals 8e on a respective pair 7 of signal contacts 8 are of the same length to reduce or minimize signal skew.

FIG. 4 discloses further details of construction that are similar for each single ground contact 9. Each ground contact 9 is of unitary construction, stamped and formed from a metal strip, for example. Each ground contact 9 extends along a centerline 9c. Each ground contact 9 is bifurcated to provide a respective pair of ground contact portions 9a. The ground contact portions 9a are in the form of resilient spring fingers that extend lengthwise of a respective elongated body portion 9b. Further, the ground contact portions 9a oppose a pair 7 of signal contacts 8, specifically, the respective mating contact portions 8a, to further extend the length of a corresponding signal transmission line pair 12 to the ends of the mating contact portions 8a. The elongated body portion 9b has respective laterally projecting, blunt barbs 9d, for purposes to be described.

FIG. 4 discloses the two consecutive transmission line pairs 12 arranged as though they would be arranged in an electrical connector 1. Each signal transmission line pair 12 has a pair 7 of signal contacts 8 in one contact row 6 opposing a ground contact 9 in another contact row 6. A ground contact 9 of a consecutive signal transmission line pair 12 faces in a reverse, or inverted, direction from the one faced by a ground contact 9 of a previous signal transmission line pair 12. A ground contact 9 of the consecutive signal transmission line pair 12 is in the same contact row 6 as is a pair 7 of signal contacts 8 of the previous signal transmission line pair 12, such that each consecutive signal transmission line pair 12 faces in an inverted direction from the one faced by a previous signal transmission line pair 12. Advantageously, the electrical connector 1 minimizes cross talk between different pairs 7 of signal contacts 8 by having consecutive signal transmission line pairs 12 facing in alternating inverted directions, which avoids an arrangement of consecutive pairs 7 of signal contacts 8 in the same contact row, as was provided by prior, known electrical connectors.

With further reference to FIG. 4, each single ground contact 9 has a single ground terminal 9e joined to the elongated body portion 9b. The single ground terminal 9e is in the form of a slender pin. Alternatively, the single ground terminal 9e may have another form, such as, a resilient spring finger or solder tab or compliant pin. The single ground terminal 9e is bent where it joins the body portion 9b to extend at a right angle with the remainder of the ground contact 9. Alternatively, the single ground terminal 9e may extend at any desired angle or may extend without a bend. Each single ground terminal 9e extends to be arranged in an intervening, ground terminal row 14 indicated by a broken line in FIG. 4. The intervening terminal row 14 that has each single ground terminal 9e for the consecutive transmission line pairs 12, intervenes between, without intersecting, the two signal terminal rows 13 in which are arranged the pairs of signal terminals 8e for the consecutive signal transmission line pairs 12.

The ground terminals 9 extending to the intervening terminal row 14 serve to intervene between the consecutively arranged pair of signal terminals 8e and the previously arranged pair of signal terminals 8e, which minimizes cross talk influences between the consecutively arranged pair of signal terminals 8e and the previously arranged pair of signal terminals 8e. Further, respective ground contacts 9 have respective single ground terminals 9e, which reduces the number of terminals or tails on each of the ground contacts 9.

Each signal transmission line pair 12 has a pair of signal terminals 8e and a single ground terminal 9e arranged in a group 15 of terminals 8e and 9e for the signal transmission line pair 12. The ground terminal 9e extends along a centerline 9g that is equidistant from the pair of signal terminals 8e of the same group 15 of terminals 8e and 9e. The signal terminals 8e of each signal transmission line pair 12 extend along the centerlines 8g that intersect corners of a base of a triangular shaped area 16 for the signal transmission line pair 12. The ground terminal 9e of each signal transmission line pair 12 extends along the centerline 9g that intersects an apex of the triangular shaped area 16. The triangular shaped area 16 for a consecutive signal transmission line pair 12 is inverted with respect to a triangular shaped area 16 for a previous signal transmission line pair 12, which arranges the pairs 7 of signal terminals 8 of the consecutive and previous signal transmission line pairs 12 a maximized distance apart to minimize cross talk influences therebetween. Additionally, the triangular shaped area 16 is minimized in size, for purposes to be described.

Figure 5:
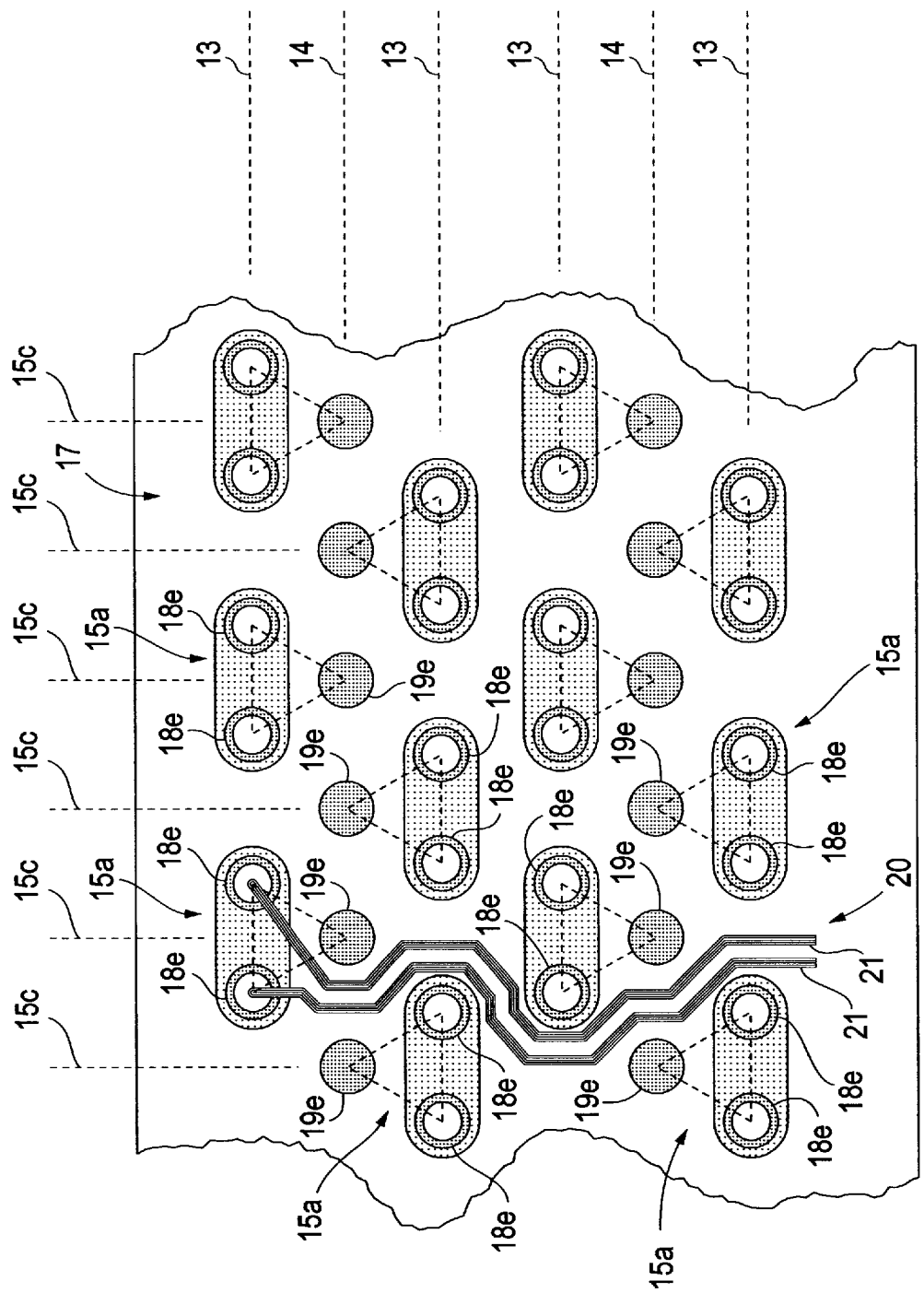
FIG. 5 is a fragmentary view of a transmission line device in the form of a circuit board.

FIG. 5 discloses a portion of a transmission line device 17, for example, a circuit board that has groups 15a of signal terminal connection areas 18e and ground terminal connection areas 19e in the form of plating lined apertures. The terminal connection areas 18e and 19e are arranged to coincide with the first terminal row 13, the second terminal row 13, and the intervening terminal row 14. Each pair of signal terminal connection areas 18e is aligned to connect with a respective pair of signal terminals 8e. Each single ground terminal connection area 19e is aligned to connect with a ground terminal 9e. Each group 15a of terminal connection areas 18e and 19e includes a pair of terminal connection areas 18e in either the first terminal row 13 or the second terminal row 13, and a single termination area 19e in the intervening terminal row 14 that is equidistant from the terminal connection areas 18e of the same group 15a of terminal connection areas 18e and 19e.

Surrounding each group 15a of terminal connection areas 18e and 19e for a signal transmission line pair 12 is a space within which to route a pair 20 of signal transmission lines 21 on the transmission line device 17. For example, FIG. 5 discloses two signal transmission lines 21 on the transmission line device 17 connecting with one of the pairs of terminal connection areas 18e. The two signal transmission lines 21 extend in a space that surrounds a respective group 15a of terminal connection areas 18e and 19e. The two signal transmission lines 21 are each 0.3 mm. wide, and are parallel spaced a distance of 0.36 mm. apart. More specifically, the space is defined, in part, by a centerline spacing of 1.75 mm. between the centerline of the intervening terminal row 14 and each centerline of the first terminal row 13 and the second terminal row 13. Further, the space is defined, in part, by a centerline spacing of 2.98 mm. between the centerlines 15c of different groups 15a.

The terminal connection areas 18e of each pair are on a 2 mm. centerline spacing, which is the same spacing between the centerlines 8g of a pair of signal terminals 8e for connection to the pair of terminal connection areas 18e. Each pair of signal terminals 8e extend along centerlines 8g that are offset from the centerlines 8c of the corresponding pair of signal contacts 8. Further, the respective laterally offset portions 8f on the signal contacts 8 situate the respective pair of signal terminals 8e farther apart. Further, the triangular area 16 is optimized by having the single ground terminal 9e extending along a centerline 9g that is equidistant from the centerlines 8g of the pair of signal terminals 8e. Also, a space surrounding the group 15a of terminal connection areas 18e and 19e is provided for routing the signal transmission lines 21 on the transmission line device 17.

Figure 6:
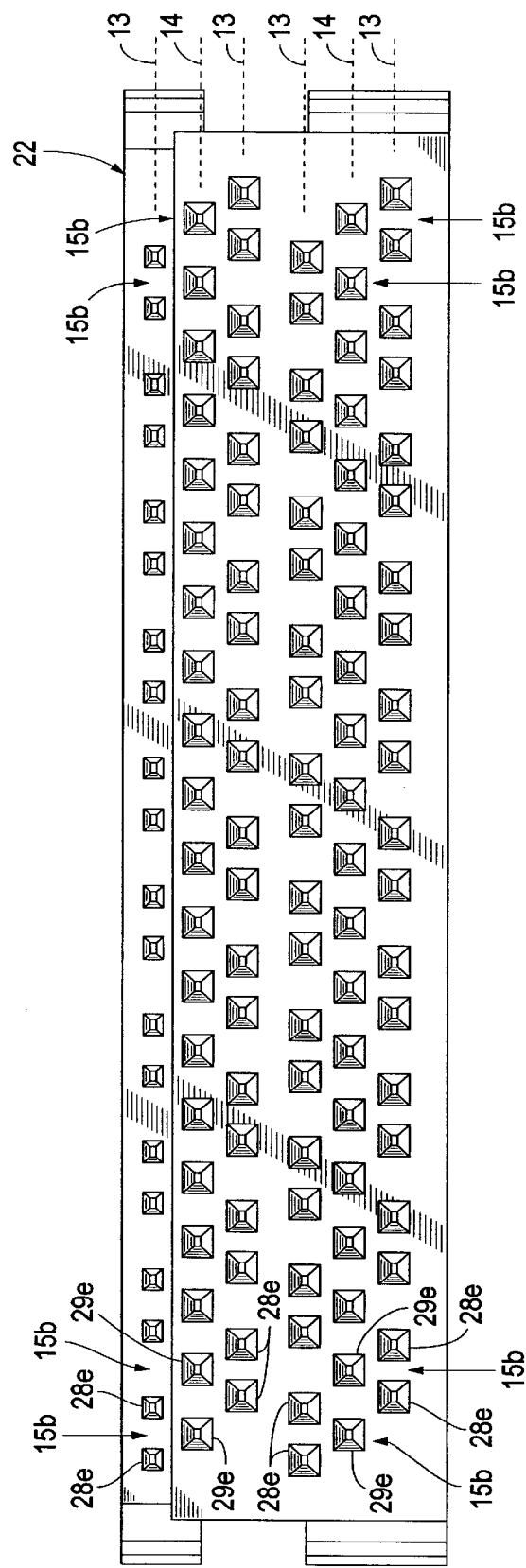
FIG. 6 is a top view of a pin spacer for aligning and holding signal terminals and ground terminals of respective signal contacts and ground contacts.

As disclosed by FIGS. 6 and 6A, a pin spacer 22 is a device that has groups 15b of alignment openings 28e and 29e through the thickness of a thin, insulating plate. The alignment openings 28e align with, and hold the pairs of signal terminals 8e. The alignment openings 29e align with and hold the ground terminals 9e. The alignment openings 28e and 29e are arranged to coincide with the first terminal row 13, the second terminal row 13, and the intervening terminal row 14. FIG. 6A discloses that the pin spacer 22 has an upstanding, insulating rib 24 adjacent to each terminal row 14. As disclosed by FIG. 6B, each rib 24 extends between the terminal row 14 and a terminal row 13. The rib 24 extends between and along a respective ground terminal 9e and a corresponding pair of signal terminals 8e of a respective group 15, which provides insulating material between the respective ground terminal 9e and the corresponding pair of signal terminals 8e to adjust the impedance of the transmission line pair 12. The height of each rib 24 is shorter or longer to correspond to the lengths of the ground terminal 9e and the corresponding pair of signal terminals 8e of a respective group 15. According to an embodiment, there are two connector-mating portions 5 of the connector 1. An air gap 26 separates the groups 15 of one connector-mating portion 5 from the groups 15 of another connector-mating portion 5, which minimizes cross talk between the two connector-mating portions 5 of the connector 1.

Figure 7:
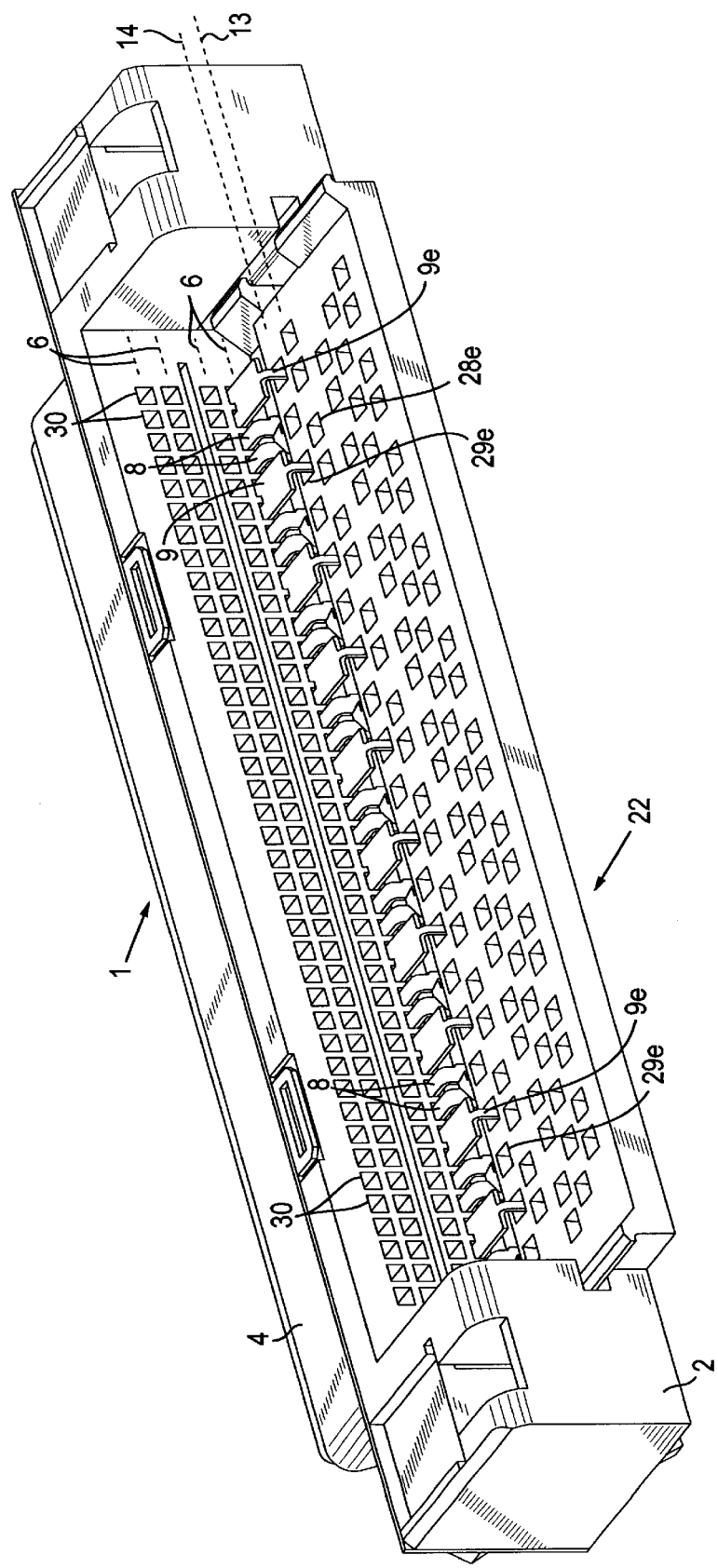
FIG. 7 is an isometric view of a composite of two receptacle type electrical connectors with a pin spacer and with signal contacts and ground contacts in one contact row of a housing.

FIG. 7 discloses a beginning of an assembly procedure for assembling the ground contacts 9 and pairs 7 of signal contacts 8 with the pin spacer 22 and the housing 2 of the receptacle type connector 1. The assembly procedure is applicable to the plug type of electrical connector 1, as well. For the purpose of illustration, the assembly procedure will now be described with reference solely to the receptacle type of electrical connector 1. With reference to FIG. 7, the housing 2 has the contact rows 6 defined by contact receiving passages 30 through the housing 2. There are two contact rows 6 for each of the two electrical receptacles that are stacked, one on the other.

With reference to FIG. 7, ground contact portions 9a of respective ground contacts 9, and pairs 7 of signal contacts 8, are mounted in adjacent passages 30 of a lowest one of the contact rows 6, and are retained in place. Specifically, the ground contacts 9 are retained in place by the barbs 9d abutting against the insides of the passages. The pairs 7 of signal contacts 8 are retained in place by the barbs 8d abutting against the insides of the passages. Each pair 7 of signal contacts 8 in a contact row 6 is beside a ground contact 9 in the same contact row 6, which reduces or minimizes cross talk influences from one pair 7 of signal contacts 8 to another pair 7 of signal contacts 8 in the same contact row 6.

The pairs of signal terminals 8e on respective pairs 7 of signal contacts 8 extend to project through respective alignment openings 28e through the pin spacer 22. The alignment openings 28e are in the first terminal row 13. The ground terminals 9e on the ground contacts 9 extend to project through respective alignment openings 29e through the pin spacer 22, which are in the intervening terminal row 14. A vacant alignment opening 29e in the intervening terminal row 14 is beside each ground terminal 9e in the same terminal row 14.

Figure 8:
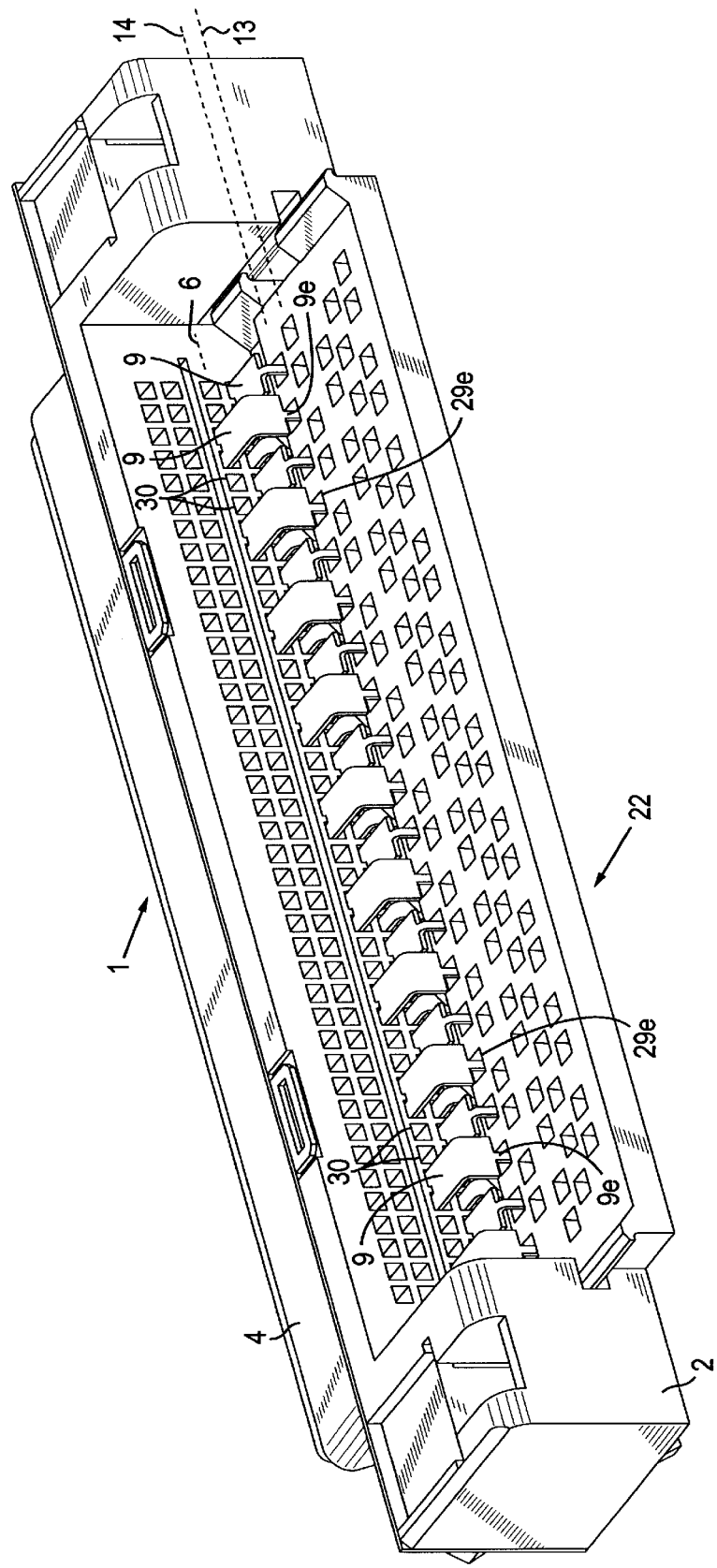
FIG. 8 is a view similar to FIG. 7, further disclosing a pin spacer and a housing partially assembled with multiple pairs of signal contacts and multiple ground contacts in a first contact row, and ground contacts in a second contact row.

The assembly procedure continues with reference to FIG. 8 that discloses ground contacts 9 being mounted in alternate pairs of passages 30 of another contact row 6 that is the adjacent contact row 6 above the lowest contact row 6. The ground contacts 9 are retained in place by the barbs 9d impinging the sides of the passages 30. A pair of empty passages 30 is beside each ground contact 9 in the same contact row 6. The ground terminals 9e on the ground contacts 9 extend to project through respective, previously vacant, alignment openings 29e through the pin spacer 22, which are in the intervening terminal row 14. The intervening terminal row 14 of alignment openings 29e becomes filled with respective ground terminals 9e.

Figure 9:
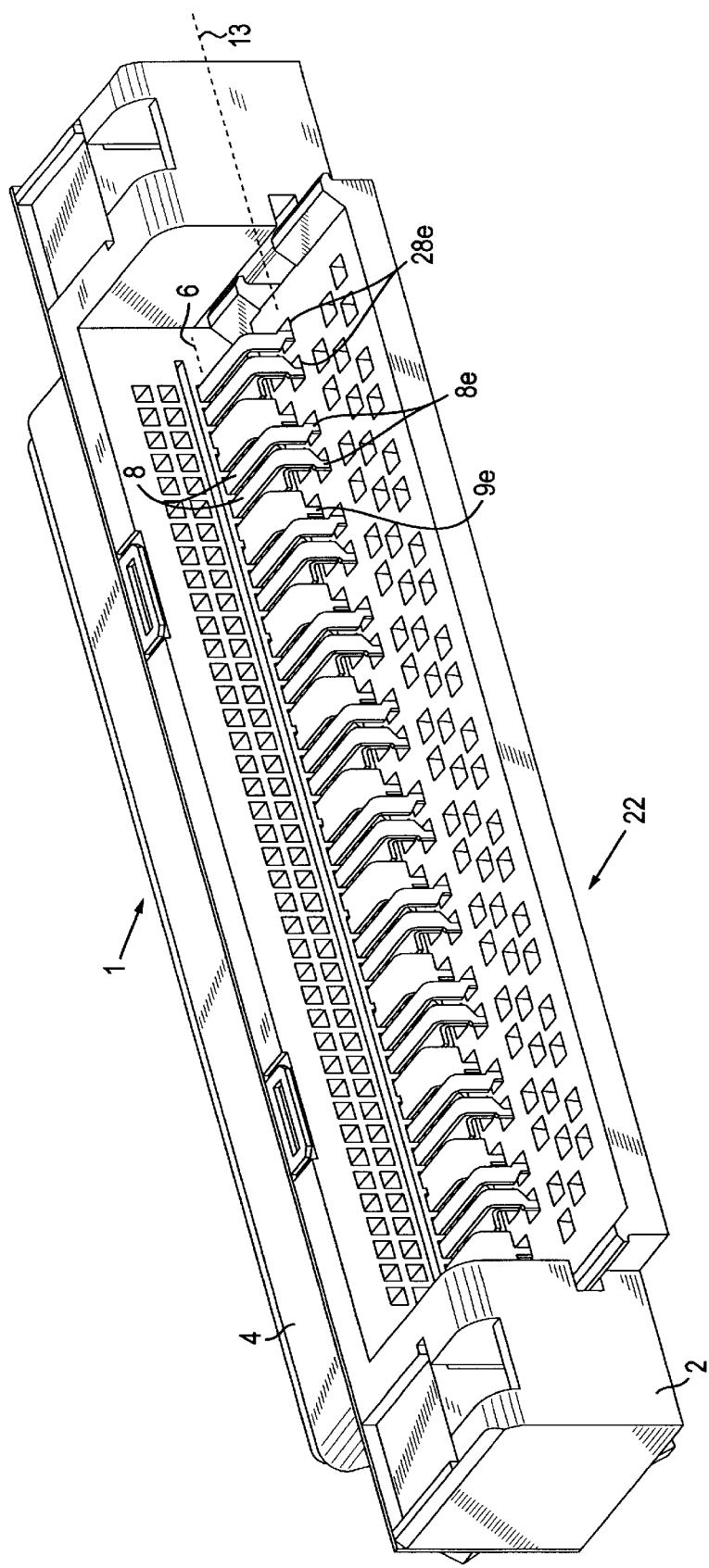
FIG. 9 is a view similar to FIG. 8, further disclosing a pin spacer and a housing with signal contacts and ground contacts in two contact rows to provide a row of signal transmission line pairs.

With reference to FIG. 9, signal contacts 8 are mounted in the previously vacant pairs of passages 30 beside a ground contact 9 in the same contact row 6. The pairs of signal terminals 8e on the signal contacts 8 extend to project through respective alignment openings 28e through the pin spacer 22 in the second terminal row 13. The two lowermost contact rows 6, which are fully assembled with pairs 7 of signal contacts 8 and ground contacts 9, are on opposite sides of at least one connector-mating portion 5 of the connector 1. The connector-mating portion 5, as shown in FIG. 2, is a plug-receiving opening of the receptacle type of connector 1. For the plug type of connector 1, as shown in FIG. 1, the two contact rows 6 would be on opposite sides of a mating portion 5 that is an electrical plug portion. The two contact rows 6 having pairs 7 of signal contacts 8 and opposing ground contacts 9, provide a single row of side by side, signal transmission line pairs 12 of controlled characteristic impedance. As disclosed by FIG. 9, assembly of a single receptacle type electrical connector 1 is now completed, as shown as the lower connector 1 in FIG. 9.

FIG. 9 discloses that a single electrical connector 1 may be provided by having at least one connector-mating portion 5 in a housing 2, together with two contact rows 6 having pairs 7 of signal contacts 8 and opposing ground contacts 9 providing a single row of side by side, signal transmission line pairs 12.

Figure 10:
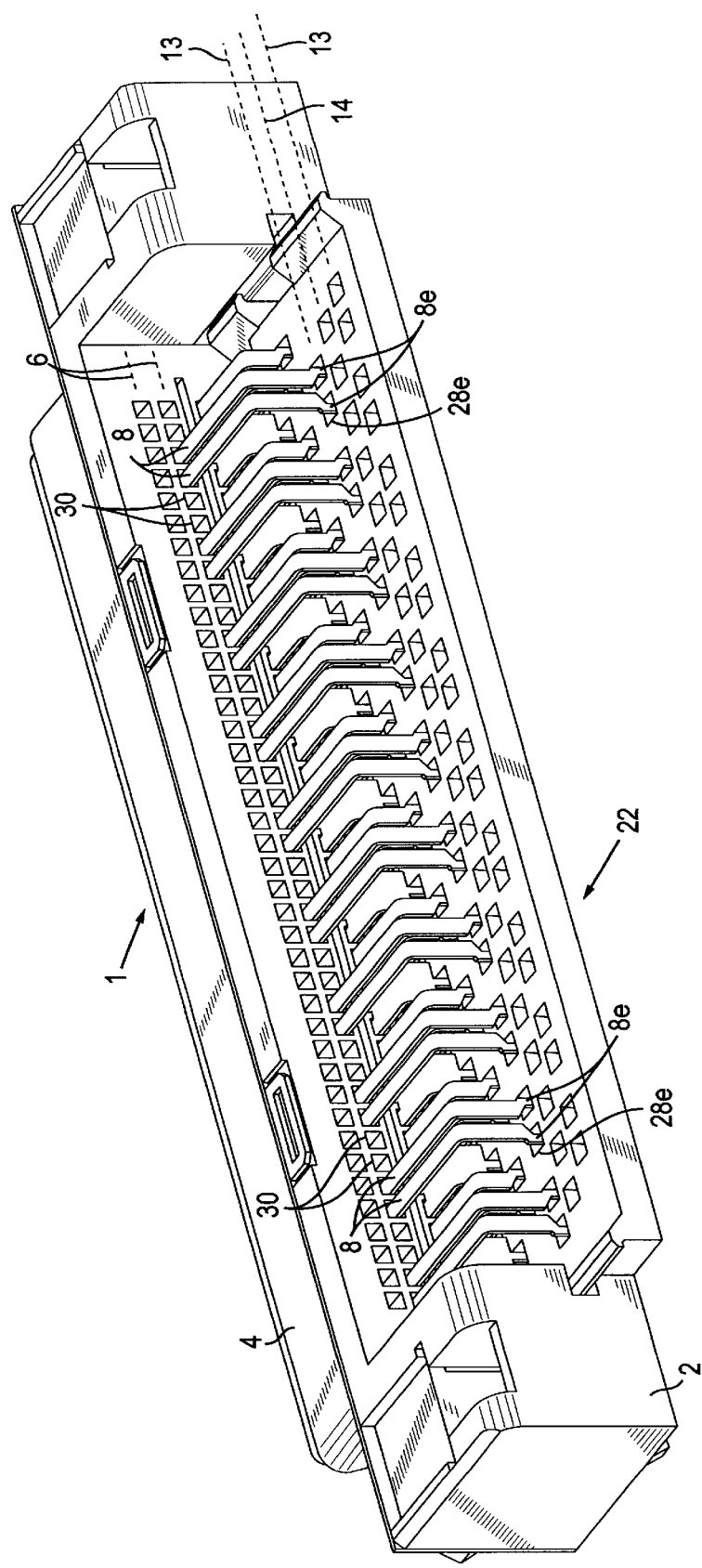
FIG. 10 is a view similar to FIG. 8, further disclosing a pin spacer and a housing with signal contacts and ground contacts in a two contact rows, and signal contacts in a third contact row.

FIG. 9 discloses that a single electrical connector 1 may be provided by having one connector-mating portion 5 together with two contact rows 6 of pairs 7 of signal contacts 8 and opposing ground contacts 9 that provide a row of side by side, signal transmission line pairs 12. To provide an embodiment having multiple, specifically, two, electrical connectors 1, stacked one on the other, FIG. 10 discloses an assembly procedure for assembling the ground contacts 9 and pairs 7 of signal contacts 8 with an upper, second one of the electrical connectors 1. With reference to FIG. 10, signal contacts 8 are mounted in alternate pairs of passages 30 of one of the contact rows 6, and are retained in place. Specifically, the barbs 8d on the signal contacts 8 abut against the insides of the passages 30 to retain the signal contacts 8 in place. The signal terminals 8e on respective signal contacts 8 extend to project through respective alignment openings 28e through the pin spacer 22. The alignment openings 28e are in one terminal row 13.

Figure 11:
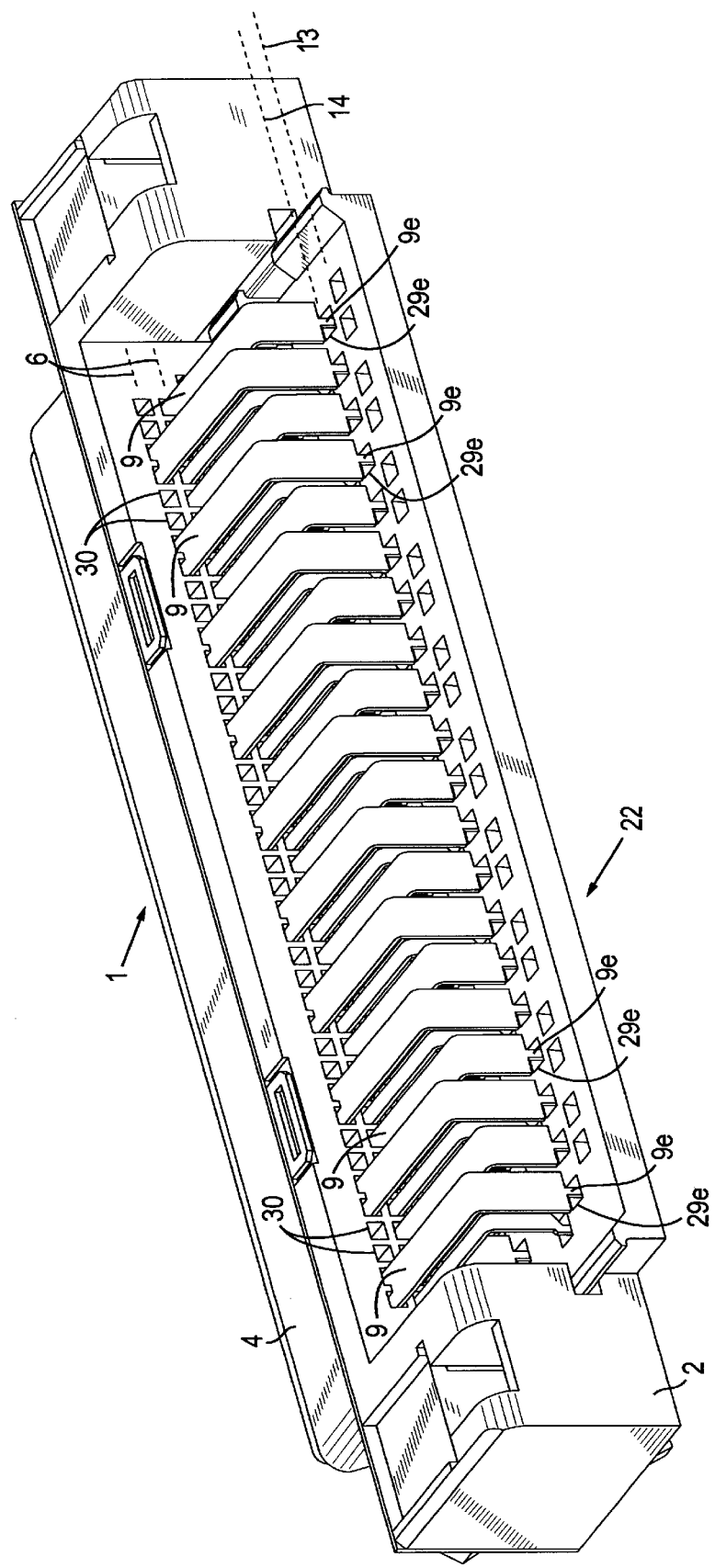
FIG. 11 is a view similar to FIG. 10, further disclosing ground contacts in two contact rows.

The assembly procedure for the upper, second one of the electrical connectors 1 continues with reference to FIG. 11. Specifically, a ground contact 9 is mounted and retained in place in each pair of previously vacant passages 30 beside a pair of signal contacts 8 in the same contact row 6. Additional ground contacts 9 are mounted and retained in place in alternate pairs of passages 30 of a second, uppermost contact row 6. There is a pair of vacant passages 30 beside each ground contact 9 in the second, uppermost contact row 6. The ground terminals 9e on the ground contacts 9 extend to project through respective alignment openings 29e through the pin spacer 22, which are in the intervening terminal row 14.

Figure 12:
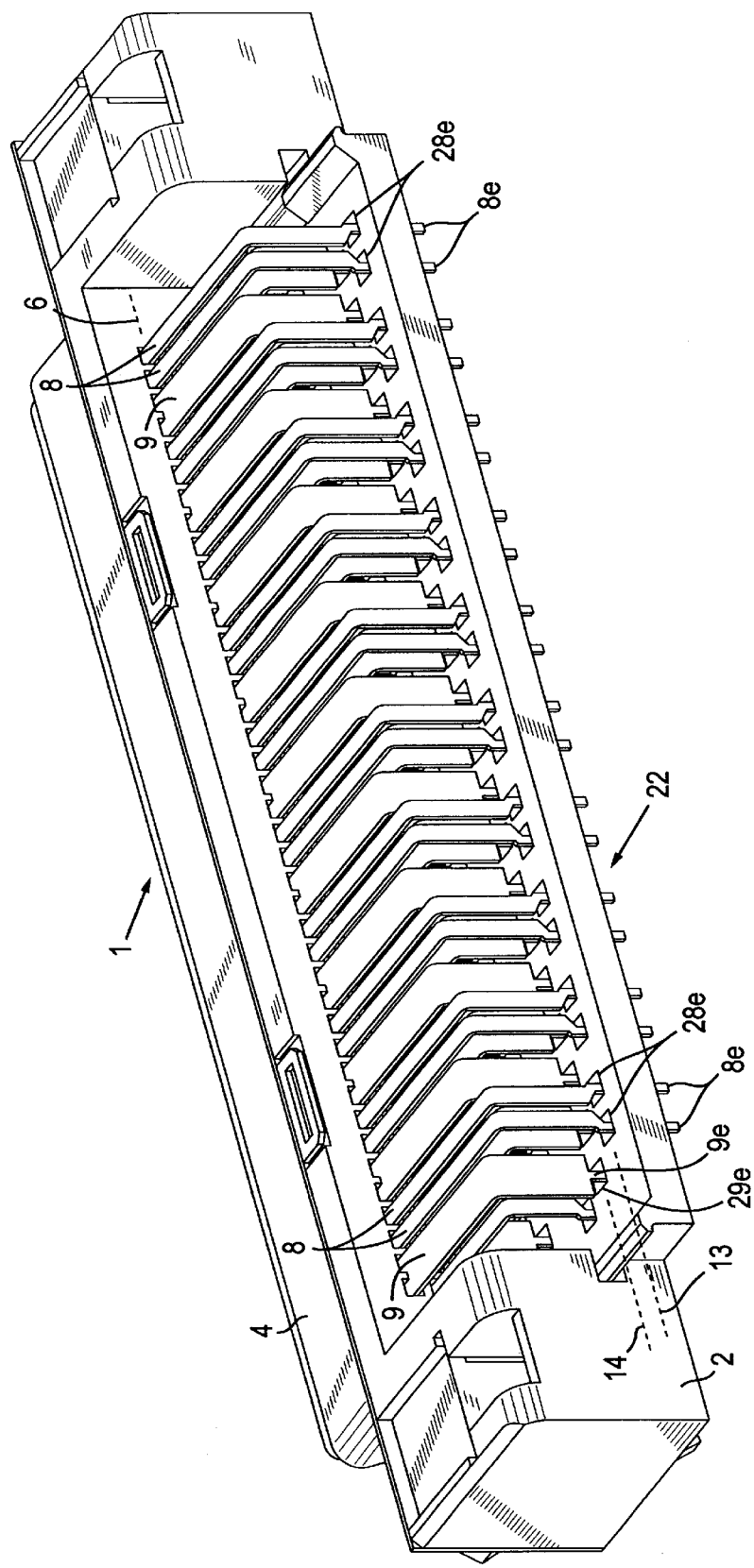
FIG. 12 is a view similar to FIG. 10, further disclosing a pin spacer and a housing with signal contacts and ground contacts providing a composite electrical connector having two electrical connectors stacked one on the other.

The assembly procedure for the upper, second one of the electrical connectors 1 continues with reference to FIG. 12. Specifically, signal contacts 8 are mounted in the previously vacant pairs of passages 30 in the uppermost contact row 6. The signal terminals 8e on respective signal contacts 8 extend to project through respective alignment openings 28e through the pin spacer 22, which are in a second terminal row 13. The two contact rows 6 having pairs 7 of signal contacts 8 and ground contacts 9 provide a second row of side by side, signal transmission line pairs 12. The assembly procedure is now completed to provide a composite electrical connector 1 having the two receptacle type of connectors 1, as shown in FIG. 2. The assembly procedure is repeatable to provide a composite electrical connector 1 having the two electrical plug type connectors 1, as shown in FIG. 1.

With respect to each of the composite connectors 1, each pair 7 of signal contacts 8 in a contact row 6 is beside a ground contact 9 in the same contact row 6. The two contact rows 6, which are fully assembled with pairs 7 of signal contacts 8 and ground contacts 9, are on opposite sides of a mating portion 5 of connector 1. Each connector-mating portion 5 is either, a plug receiving opening of the receptacle type of connector 1, or a plug portion of the plug type of connector 1.

Other embodiments and modifications of the invention are intended to be covered by the spirit and scope of the appended claims.

What is claimed is:

1. An electrical connector comprising:

a housing which holds signal contacts and ground contacts that are arranged in at least two rows, each of the rows including at least a pair of adjacent said signal contacts and one of said ground contacts, wherein each said pair of adjacent said signal contacts in one of said rows is opposed to a respective said ground contact in another of said rows to form a signal transmission line pair, the signal transmission line pairs being arranged consecutively along the rows in an alternating inverted sequence such that, within each said row, said pair of adjacent said signal contacts of one said signal transmission line pair is adjacent to said ground contact of a different said signal transmission line pair.

2. The electrical connector as recited in claim 1, wherein each said ground contact has thereon a pair of ground contact portions which are opposed to said pair of adjacent said signal contacts of said signal transmission line pair.

3. The electrical connector as recited in claim 1 wherein the signal contacts include respective signal pin terminals extending in two signal pin rows, and the ground contacts include respective ground pin terminals extending in a ground pin row between the two signal pin rows.

4. The electrical connector as recited in claim 3, and further comprising an insulating pin spacer having an insulating rib extending between the ground pin row and one of the signal pin rows.

5. The electrical connector as recited in claim 1 wherein, for each said signal transmission line pair, said pair of adjacent said signal contacts and said ground contact include respective terminal portions that are arranged to project at apices of a triangular shaped pattern.

6. The electrical connector as recited in claim 5 wherein the triangular shaped pattern for a consecutive said signal transmission line pair is inverted with respect to the triangular shaped pattern for a previous said signal transmission line pair.

7. The electrical connector as recited in claim 1 wherein said at least two rows are on opposite sides of an intervening connector-mating portion.

8. An electrical connector comprising:

a housing, two contact rows on respective opposite sides of an intervening mating portion of the housing, each of the two contact rows including signal contacts and ground contacts, each said ground contact in one of the two contact rows opposing a respective pair of adjacent said signal contacts in the other of the two contact rows to provide signal transmission line pairs of controlled characteristic impedance, the pairs of signal contacts in the two contact rows having respective pairs of signal terminals arranged in two nonintersecting signal terminal rows, and the ground contacts in the two contact rows having respective ground terminals arranged in an intervening ground terminal row that is disposed between the two signal terminal rows.

9. The electrical connector as recited in claim 8 wherein each said ground contact has thereon a pair of ground contact portions which are opposed to said pair of adjacent said signal contacts of said signal transmission line pair.

10. The electrical connector as recited in claim 8 wherein, for each said signal transmission line pair, said pair of adjacent said signal contacts and said ground contact include respective terminal portions that are arranged to project at apices of a triangular shaped pattern.

11. The electrical connector as recited in claim 10 wherein the triangular shaped pattern for a consecutive said signal transmission line pair is inverted with respect to the triangular shaped pattern for a previous said signal transmission line pair.

12. The electrical connector as recited in claim 8, and further comprising an insulating pin spacer having an insulating rib extending between the ground terminal row and one of the signal terminal rows.

* * * * *